(12) United States Patent
Park et al.

(10) Patent No.: US 11,436,984 B2
(45) Date of Patent: *Sep. 6, 2022

(54) PIXEL AND ORGANIC LIGHT EMITTING DISPLAY DEVICE HAVING THE SAME

(71) Applicant: Samsung Display Co., Ltd., Yongin-si (KR)

(72) Inventors: Yongsung Park, Seoul (KR); Minwoo Byun, Seongnam-si (KR); Keonwoo Kim, Cheonan-si (KR); Seungbin Lee, Cheonan-si (KR); Deok-young Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/306,882

(22) Filed: May 3, 2021

(65) Prior Publication Data

US 2021/0256916 A1     Aug. 19, 2021

Related U.S. Application Data

(63) Continuation of application No. 16/216,019, filed on Dec. 11, 2018, now Pat. No. 11,024,237.

(30) Foreign Application Priority Data

Jan. 15, 2018 (KR) .......................... 10-2018-0005248

(51) Int. Cl.
*G09G 3/3291* (2016.01)
*H01L 51/52* (2006.01)
(Continued)

(52) U.S. Cl.
CPC ......... *G09G 3/3291* (2013.01); *G09G 3/3233* (2013.01); *G09G 3/3258* (2013.01);
(Continued)

(58) Field of Classification Search
CPC ...... G09G 3/32; G09G 3/3291; G09G 3/3233; G09G 3/3258; G09G 3/3266;
(Continued)

(56) References Cited

U.S. PATENT DOCUMENTS 7,564,452 B2   7/2009   Komiya
9,041,704 B2   5/2015   Lee et al.
(Continued)

FOREIGN PATENT DOCUMENTS

CN    1874627     12/2006
CN   104112422     10/2014
(Continued)

OTHER PUBLICATIONS

Non-Final Office Action dated Jan. 16, 2020, in U.S. Appl. No. 16/216,019.
(Continued)

*Primary Examiner* — Alexander Eisen
*Assistant Examiner* — Cory A Almeida
(74) *Attorney, Agent, or Firm* — H.C. Park & Associates, PLC

(57) ABSTRACT

A pixel includes an organic light emitting diode including an anode electrode and a cathode electrode; a driving transistor including an input electrode connected to a first node (FN), a control electrode connected to a second node, and an output electrode connected to a third node; a switching transistor to apply a data signal to the FN in response to a scan signal in a second period; a first initialization transistor to apply a first initialization voltage to the second node in response to an initialization control signal in a first period (FP); a second initialization transistor to apply a second initialization voltage having a voltage level different from the first initialization voltage to the anode electrode in response to the initialization control signal in the FP; and an (Continued)

on-bias transistor to apply a first driving voltage to the FN in response to an on-bias control signal in the FP.

18 Claims, 16 Drawing Sheets

(51) Int. Cl.
*G09G 3/3266* (2016.01)
*G09G 3/3258* (2016.01)
*H01L 27/32* (2006.01)
*G09G 3/3233* (2016.01)

(52) U.S. Cl.
CPC ....... *G09G 3/3266* (2013.01); *H01L 27/3276* (2013.01); *H01L 51/5206* (2013.01); *H01L 51/5221* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2300/0866* (2013.01); *G09G 2310/08* (2013.01)

(58) Field of Classification Search
CPC ... G09G 2300/0426; G09G 2300/0452; G09G 2300/0819; G09G 2300/0842; G09G 2300/0861; G09G 2300/0866; H01L 27/3276; H01L 51/5206; H01L 51/5221
See application file for complete search history.

(56) References Cited

U.S. PATENT DOCUMENTS

| | | | |
|---|---|---|---|
| 9,460,662 B2 | 10/2016 | Lee et al. | |
| 2008/0158108 A1* | 7/2008 | Hwang | H01L 27/3272 345/76 |
| 2011/0025659 A1 | 2/2011 | Kwak et al. | |
| 2014/0313180 A1 | 10/2014 | Woo | |
| 2014/0333600 A1 | 11/2014 | Lee et al. | |
| 2015/0243715 A1 | 8/2015 | Shin | |
| 2015/0287362 A1* | 10/2015 | Lee | G09G 3/3258 345/77 |
| 2016/0125809 A1* | 5/2016 | Hwang | G09G 3/3258 345/212 |
| 2016/0351122 A1 | 12/2016 | Jung et al. | |
| 2017/0337875 A1 | 11/2017 | Jeon et al. | |

FOREIGN PATENT DOCUMENTS

| | | |
|---|---|---|
| KR | 20-1999-0039763 | 11/1999 |
| KR | 10-2014-0134045 | 11/2014 |
| KR | 10-2016-0052943 | 5/2016 |
| KR | 10-2017-0078075 | 7/2017 |
| KR | 10-1840123 | 3/2018 |

OTHER PUBLICATIONS

Final Office Action dated Jul. 24, 2020, in U.S. Appl. No. 16/216,019.
Notice of Allowance dated Feb. 2, 2021, in U.S. Appl. No. 16/216,019.

\* cited by examiner

PIXEL AND ORGANIC LIGHT EMITTING DISPLAY DEVICE HAVING THE SAME

CROSS-REFERENCE TO RELATED APPLICATION

This application is a Continuation of U.S. patent application Ser. No. 16/219,019, filed Dec. 11, 2018, which issued as U.S. Pat. No. 11,024,237, which claims priority to and the benefit of Korean Patent Application No. 10-2018-0005248, filed Jan. 15, 2018, which is hereby incorporated by reference for all purposes as if fully set forth herein.

BACKGROUND

Field

One or more exemplary embodiments generally relate to display devices, and more particularly, to a pixel and an organic light emitting display device including the same.

Discussion

In general, an organic light emitting display device includes a plurality of pixels. Each of the pixels typically includes an organic light emitting diode and a circuit unit controlling the organic light emitting diode. The circuit unit may include at least a switching transistor, a driving transistor, and a storage capacitor. The organic light emitting diode includes an anode electrode, a cathode electrode, and an organic light emitting layer disposed between the anode electrode and the cathode electrode. The organic light emitting diode emits light when a voltage higher than a threshold voltage of the organic light emitting layer is applied to between the anode electrode and the cathode electrode.

The above information disclosed in this section is only for understanding the background of the inventive concepts, and, therefore, may contain information that does not form prior art.

Summary

Some exemplary embodiments provide a pixel capable of improving display quality of a display device.

Some exemplary embodiments provide a display device including a pixel capable of improving display quality of the display device.

Additional aspects will be set forth in the detailed description which follows, and, in part, will be apparent from the disclosure, or may be learned by practice of the inventive concepts.

According to some exemplary embodiments, a pixel includes pixel includes an organic light emitting diode, a driving transistor, a switching transistor, a first initialization transistor, a second initialization transistor, and an on-bias transistor. The organic light emitting diode includes an anode electrode and a cathode electrode. The driving transistor includes an input electrode connected to a first node, a control electrode connected to a second node, and an output electrode connected to a third node. The switching transistor is configured to apply a data signal to the first node in response to reception of a scan signal in a second period. The first initialization transistor is configured to apply a first initialization voltage to the second node in response to reception of an initialization control signal in a first period. The second initialization transistor is configured to apply a second initialization voltage having a voltage level different from the first initialization voltage to the anode electrode in response to reception of the initialization control signal in the first period. The on-bias transistor is configured to apply a first driving voltage to the first node in response to reception of an on-bias control signal in the first period.

In some exemplary embodiments, the first initialization transistor may include a control electrode configured to receive the initialization control signal in the first period, an input electrode configured to receive the first initialization voltage, and an output electrode connected to the second node; and the second initialization transistor may include a control electrode configured to receive the initialization control signal, an input electrode configured to receive the second initialization voltage, and an output electrode connected to the anode node.

In some exemplary embodiments, the second initialization voltage may have a voltage level lower than the first initialization voltage.

In some exemplary embodiments, the cathode electrode of the organic light emitting diode may be configured receive a second driving voltage, and the second driving voltage may have a voltage level lower than the second initialization voltage.

In some exemplary embodiments, the second driving voltage may be in a range from about −9 volts to about −11 volts.

In some exemplary embodiments, a difference in electric potential between the second driving voltage and the second initialization voltage may be smaller than a threshold voltage of the organic light emitting diode.

In some exemplary embodiments, the difference in electric potential may be in a range from about 0.5 volts to about 0.6 volts.

In some exemplary embodiments, the switching transistor may include a control electrode configured to receive the scan signal in the second period, an input electrode configured to receive the data signal, and an output electrode connected to the first node.

In some exemplary embodiments, the on-bias transistor may include a control electrode configured to receive an on-bias control signal in the first period, an input electrode configured to receive the first driving voltage, and an output electrode connected to the second node.

In some exemplary embodiments, in the first period, the initialization control signal and the on-bias control signal may respectively turn on the first initialization transistor and the on-bias transistor.

In some exemplary embodiments, the first initialization voltage may have a voltage level lower than a threshold voltage of the driving transistor.

In some exemplary embodiments, the pixel may further include a first control transistor including a control electrode configured to receive the scan signal in the second period, an input electrode connected to the second node, and an output electrode connected to an output electrode of the driving transistor.

In some exemplary embodiments, the pixel may further include: a second control transistor including a control electrode configured to receive a light emitting control signal in a light emitting period, an input electrode connected to the third node, and an output electrode connected to the anode electrode of the organic light emitting diode; and a third control transistor including a control electrode configured to receive the light emitting control signal, an input electrode configured to receive the first driving voltage, and an output electrode connected to the first node.

In some exemplary embodiments, the pixel may further include a storage capacitor connected between the second node and a node configured to receive the first driving voltage.

In some exemplary embodiments, the pixel may further include a first auxiliary electrode facing the control electrode of the driving transistor, the first auxiliary electrode may be configured to receive the first driving voltage.

In some exemplary embodiments, the first auxiliary electrode may also face the input electrode of the driving transistor.

According to some exemplary embodiments, a pixel includes pixel includes an organic light emitting diode, a driving transistor, a switching transistor, a first initialization transistor, a second initialization transistor, and an on-bias transistor. The organic light emitting diode includes an anode electrode and a cathode electrode. The driving transistor includes an input electrode connected to a first node, a control electrode connected to a second node, and an output electrode connected to a third node. The switching transistor is configured to apply a data signal to the first node in response to reception of a scan signal in a second period. The first initialization transistor is configured to apply a first initialization voltage to the second node in response to reception of a first initialization control signal in a first period. The second initialization transistor is configured to apply a second initialization voltage having a voltage level different from the first initialization voltage to the anode electrode in response to reception of a second initialization control signal. The on-bias transistor is configured to apply a first driving voltage to the first node in response to reception of an on-bias control signal in the first period.

In some exemplary embodiments, the first initialization control signal may be configured to turn on the first initialization transistor in the first period, and the second initialization control signal may be configured to turn on the second initialization transistor in the second period.

In some exemplary embodiments, in the first period, the first initialization control signal and the on-bias control signal may be configured to substantially simultaneously turn on the first initialization transistor and the on-bias transistor, respectively.

According to some exemplary embodiments, an organic light emitting display device includes a scan driver, a data driver, pixels, and an initialization voltage generator. The scan driver is configured to apply scan signals to scan lines extending in a first direction and arranged in a second direction crossing the first direction. The data driver is configured to apply data signals to data lines insulated from the scan lines. At least one pixel among the pixels includes: an organic light emitting diode including an anode electrode and a cathode electrode; and a circuit configured to control a light emitting operation of the organic light emitting diode. The initialization voltage generator is configured to generate the first and second initialization voltages and to apply the first and second initialization voltages to the at least one pixel. The circuit includes: a driving transistor, a switching transistor, a first initialization transistor, a second initialization transistor, and an on-bias transistor. The driving transistor includes an input electrode connected to a first node, a control electrode connected to a second node, and an output electrode connected to a third node. The switching transistor is configured to apply a data signal among the data signals to the first node in response to reception of a scan signal among the scan signals in a second period. The first initialization transistor is configured to apply a first initialization voltage to the second node in response to reception of an initialization control signal in a first period. The second initialization transistor is configured to apply a second initialization voltage having a voltage level different from the first initialization voltage to the anode electrode in response to reception of the initialization control signal in the first period. The on-bias transistor is configured to apply a first driving voltage to the first node in response to reception of an on-bias control signal in the first period.

According to various exemplary embodiments, a first driving voltage may be applied to an input electrode of a driving transistor during an initialization period before a light emitting period, and thus, a constant on-bias voltage may be applied between the control electrode and the input electrode of the driving transistor. Accordingly, deterioration in display quality, which is typically caused when an electric potential difference between the control electrode and the input electrode of the driving transistor increases above a certain level, may be prevented. In addition, a second initialization voltage being different from a first initialization voltage may be applied to the anode electrode of the organic light emitting diode to have a constant electric potential difference with respect to the second driving voltage. Accordingly, characteristics of a black grayscale may be prevented from deteriorating, and a color spreading defect may be reduced.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
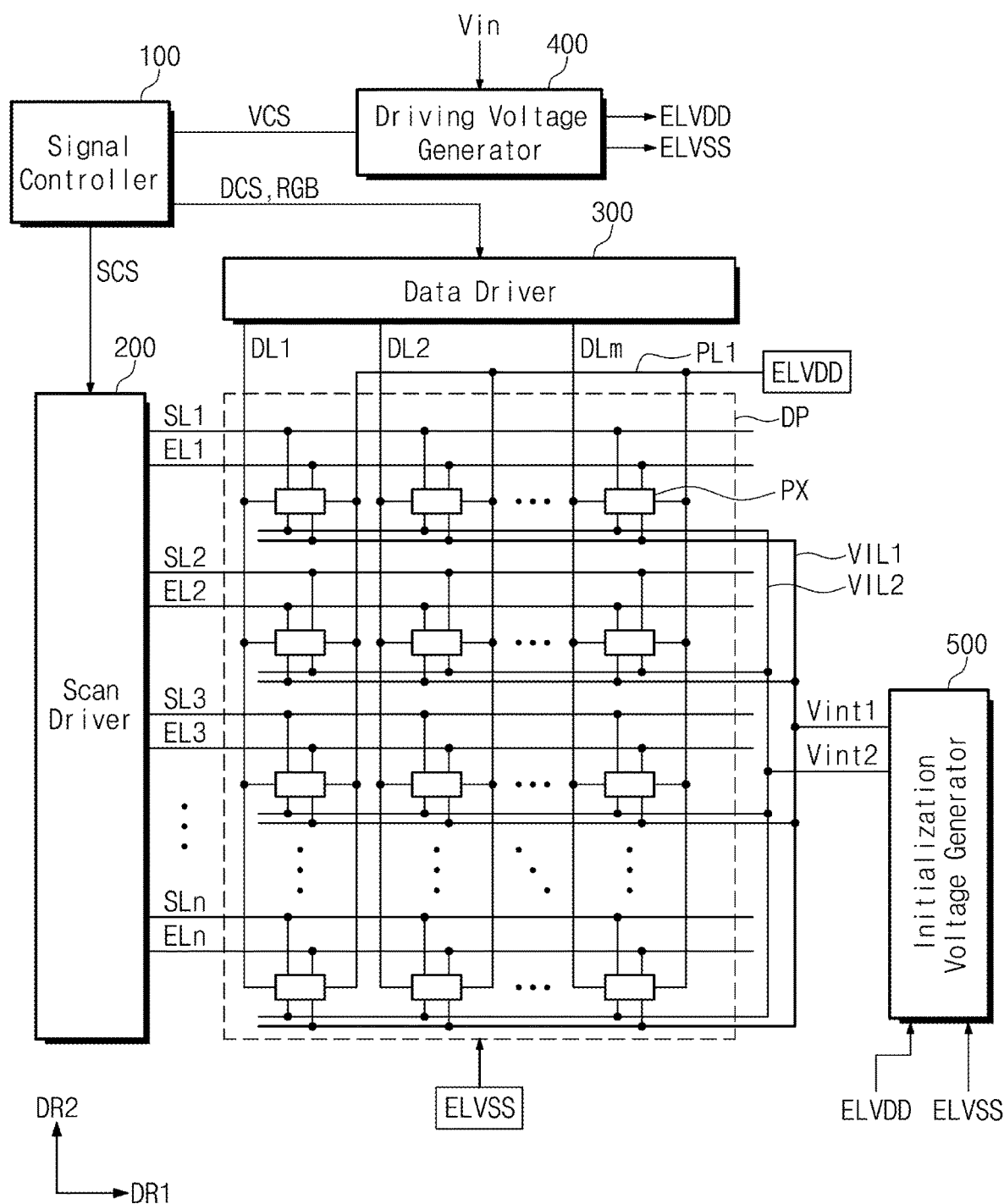
FIG. 1 is a block diagram showing an organic light emitting display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

In the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules, which may also be referred to as controllers, drivers, generators, etc. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
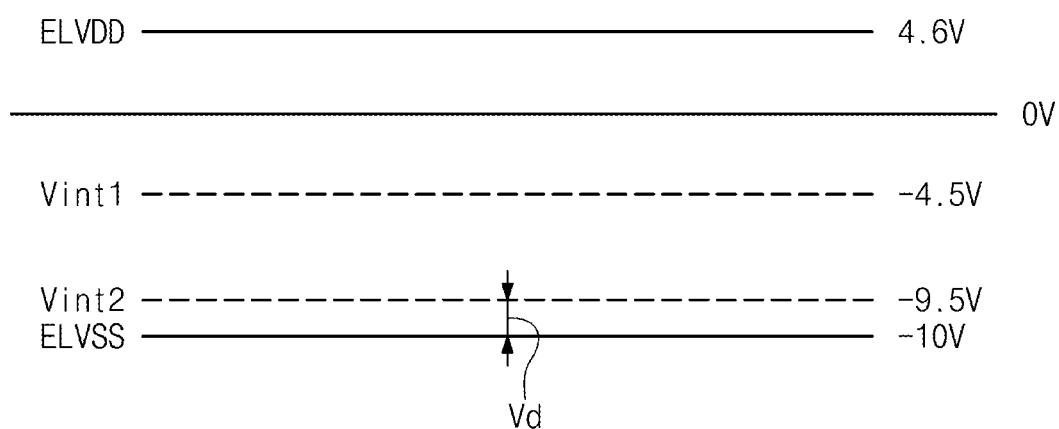
FIG. 2 is a view showing an electric potential of first and second initialization voltages shown in FIG. 1 according to some exemplary embodiments.

FIG. 1 is a block diagram showing an organic light emitting display device according to some exemplary embodiments. FIG. 2 is a view showing an electric potential of first and second initialization voltages shown in FIG. 1 according to some exemplary embodiments.

Referring to FIG. 1, the organic light emitting display device includes a signal controller 100, a scan driver 200, a data driver 300, a driving voltage generator 400, an initialization voltage generator 500, and a display panel unit DP.

The signal controller 100 receives input image signals (not shown) and converts a data format of the input image signals to a data format appropriate to an interface between the signal controller 100 and the data driver 300 to generate image data RGB. The signal controller 100 outputs the image data RGB and various control signals DCS, SCS, and VCS.

The scan driver 200 receives a scan control signal SCS from the signal controller 100. The scan control signal SCS includes a vertical start signal to start an operation of the scan driver 200 and a clock signal to determine an output timing of signals. The scan driver 200 generates a plurality of scan signals and sequentially outputs the scan signals to a plurality of scan lines SL1 to SLn described later. In addition, the scan driver 200 generates a plurality of light emitting control signals in response to the scan control signal SCS, and outputs the light emitting control signals to a plurality of light emitting lines EL1 to ELn described later.

In FIG. 1, the scan signals and the light emitting control signals are output from one scan driver 200, but the inventive concepts are not limited thereto or thereby. For instance, plural scan drivers may divide and output the scan signals, and the scan drivers may divide and output the light emitting control signals. According to some exemplary embodiments, a driving circuit generating and outputting the scan signals and a driving circuit generating and outputting the light emitting control signals may be separately implemented from each other.

The data driver 300 receives the data control signal DCS and the image data RGB from the signal controller 100. The data driver 300 converts the image data RGB to data signals, and outputs the data signals to a plurality of data lines DL1 to DLm. The data signals correspond to analog voltages respectively corresponding to grayscales of the image data RGB.

The driving voltage generator 400 receives a power voltage Vin from a power supply (not shown). The driving voltage generator 400 converts the power voltage Vin to generate a first driving voltage ELVDD and a second driving voltage ELVSS having a level lower than that of the first driving voltage ELVDD.

The driving voltage generator 400 may include a direct current (DC)-to-direct current (DC) converter. The driving voltage generator 400 may include a boost converter that boosts the power voltage Vin to generate the first driving voltage ELVDD. In addition, the driving voltage generator 400 may include a buck converter that steps down the power voltage Vin to generate the second driving voltage ELVSS.

The driving voltage generator 400 receives a driving voltage control signal VCS from the signal controller 100. The driving voltage generator 400 generates the first driving voltage ELVDD having a determined level in response to the driving voltage control signal VCS. As shown in FIG. 2, the first driving voltage ELVDD may be a positive voltage having a positive polarity with respect to zero volts, for example, a voltage within a range from about 4 volts to about 5 volts. For instance, the first driving voltage ELVDD may have a voltage level of about 4.6 volts.

The driving voltage generator 400 may generate the second driving voltage ELVSS having a determined voltage range in response to the driving voltage control signal VCS. The second driving voltage ELVSS may be a negative voltage, for example, a voltage within a range from about −9 volts to about −11 volts. For example, the second driving voltage ELVSS may have a voltage level of about −10 volts.

Referring to FIG. 1 again, the initialization voltage generator 500 receives the first driving voltage ELVDD and the second driving voltage ELVSS from the driving voltage generator 400. The initialization voltage generator 500 generates a first initialization voltage Vint1 and a second initialization voltage Vint2 using the first driving voltage ELVDD and the second driving voltage ELVSS. The first initialization voltage Vint1 and the second initialization voltage Vint2 have different voltage level from each other.

As shown in FIG. 2, the second initialization voltage Vint2 has a voltage level lower than that of the first initialization voltage Vint1. The second initialization voltage Vint2 has a constant electric potential difference Vd with respect to the second driving voltage ELVSS. As an example, the second initialization voltage Vint2 and the second driving voltage ELVSS maintain the electric potential difference Vd of about 0.5 volts to about 0.6 volts. As an example, when the second driving voltage ELVSS is in a range from about −9 volts to about −11 volts, the second initialization voltage Vint2 may be within a range from about −8.4 volts to about −10.5 volts. According to some exemplary embodiments, in a case that the second driving voltage ELVSS has a voltage level of about −10 volts, the second initialization voltage Vint2 has a voltage level of about −9.5 volts.

The first initialization voltage Vint1 has a negative voltage and has a voltage level higher than that of the second initialization voltage Vint2. The first initialization voltage Vint1 may be set to a voltage level lower than a threshold voltage of a first transistor T1. As an example, the first initialization voltage Vint1 may be about −4.5 volts.

Referring to FIG. 1 again, the display panel unit DP includes the scan lines SL1 to SLn, the light emitting lines EL1 to ELn, the data lines DL1 to DLm, and the pixels PX. The scan lines SL1 to SLn extend in a first direction DR1 and are arranged in a second direction DR2 substantially perpendicular to the first direction DR1. Each of the light emitting lines EL1 to ELn is arranged substantially parallel to a corresponding scan line among the scan lines SL1 to SLn. The data lines DL1 to DLm are insulated from the scan lines SL1 to SLn while crossing the scan lines SL1 to SLn.

Each of the pixels PX is connected to a corresponding scan line among the scan lines SL1 to SLn, a corresponding light emitting line among the light emitting lines EL1 to ELn, and a corresponding data line among the data lines DL1 to DLm. Although shown schematically in FIG. 1, each of the pixels PX may be connected to plural scan lines among the scan lines SL1 to SLn. This structure will be described in detail with reference to FIGS. 3 and 4.

Each of the pixels PX includes an organic light emitting diode (not shown) and a circuit (not shown) that controls light emission of the organic light emitting diode. The circuit includes a plurality of thin film transistors and a capacitor; however, exemplary embodiments are not limited thereto or thereby. The pixels PX include red pixels emitting a red color light, green pixels emitting a green color light, and blue pixels emitting a blue color light. The organic light emitting diode of the red pixel, the organic light emitting diode of the green pixel, and the organic light emitting diode of the blue pixel may include organic light emitting layers formed of different materials from each other.

The scan lines SL1 to SLn, the light emitting lines EL1 to ELn, the data lines DL1 to DLm, and the pixels PX may be formed on a base substrate (not shown) through a plurality of photolithography processes and a plurality of deposition processes. In addition, a sealing layer (not shown) may be further formed on the base substrate to protect the pixels PX.

The display panel unit DP receives the first driving voltage ELVDD and the second driving voltage ELVSS. The first driving voltage ELVDD is applied to the pixels PX through a first voltage line PL1. The second driving voltage ELVSS is applied to the pixels PX through electrodes (not shown) or power lines (not shown), which are formed on the display panel unit DP.

The display panel unit DP receives the first initialization voltage Vint1 and the second initialization voltage Vint2. The first initialization voltage Vint1 is applied to the pixels PX through a first initialization voltage line VIL1. The second initialization voltage Vint2 is applied to the pixels PX through a second initialization voltage line VIL2.

Figure 3:
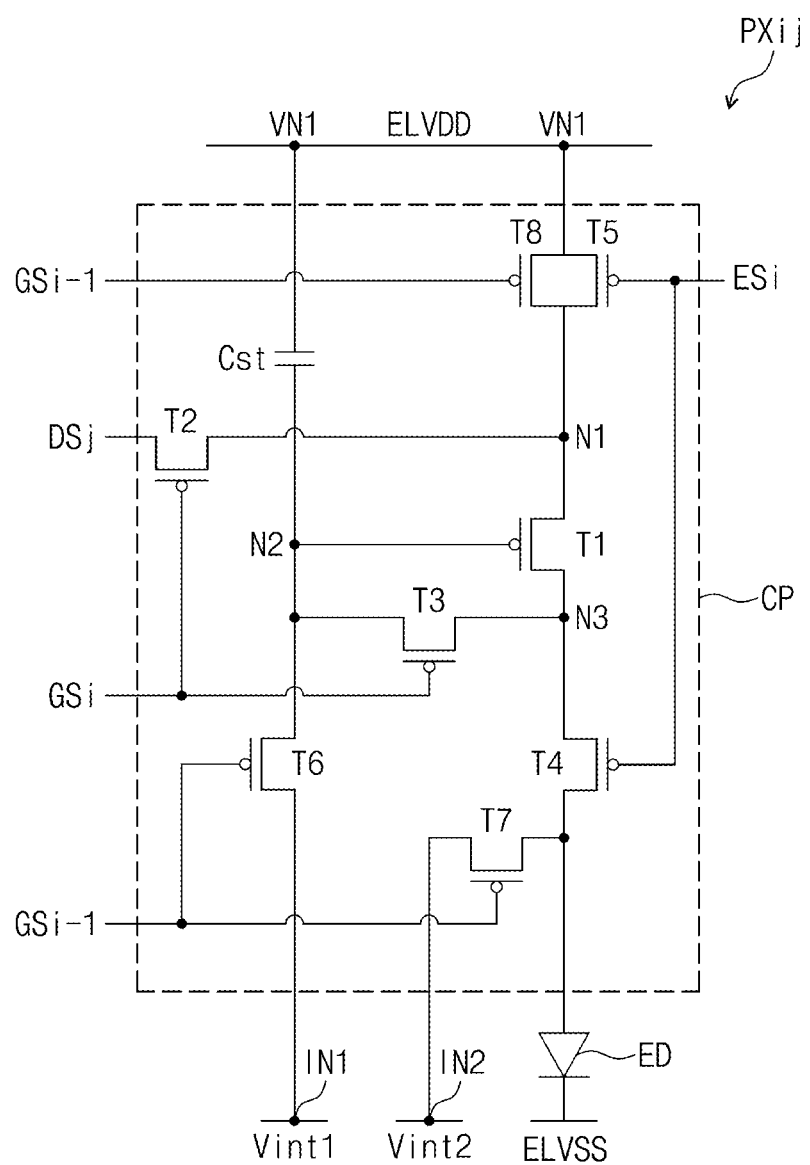
FIG. 3 is an equivalent circuit diagram of a pixel according to some exemplary embodiments.
Figure 4:
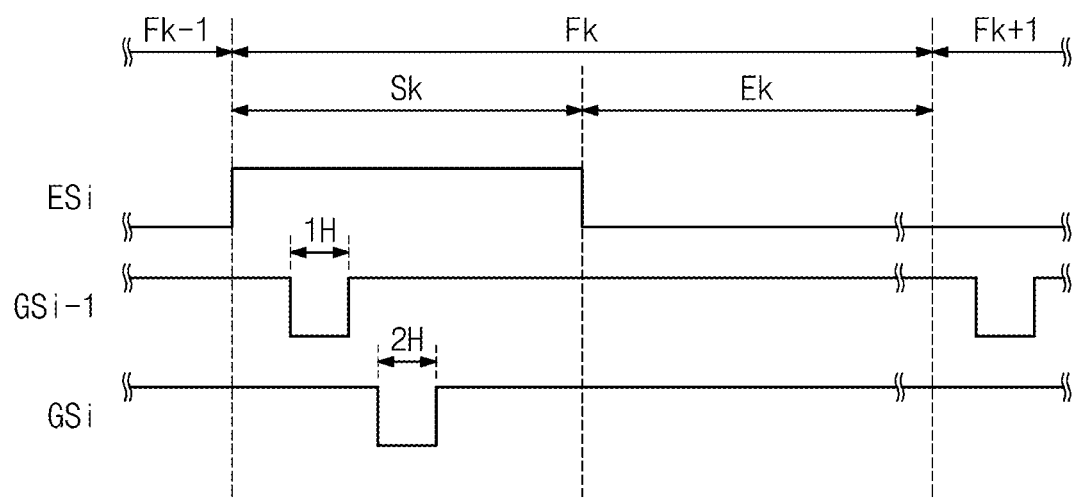
FIG. 4 is a waveform diagram showing driving signals used to drive the pixel of FIG. 3 according to some exemplary embodiments.

FIG. 3 is an equivalent circuit diagram of a pixel according to some exemplary embodiments. FIG. 4 is a waveform diagram showing driving signals used to drive the pixel of FIG. 3 according to some exemplary embodiments.

FIG. 3 shows an equivalent circuit diagram of a pixel PXij connected to an i-th scan line (not shown) among the scan lines SL1 to SLn (refer to FIG. 1), an i-th light emitting line (not shown) among the light emitting lines EL1 to ELn (refer to FIG. 1), and a j-th data line (not shown) among the data lines DL1 to DLm (refer to FIG. 1). Each of the pixels PX shown in FIG. 1 may have substantially the same circuit configuration as the equivalent circuit diagram of the pixel PXij shown in FIG. 3; however, exemplary embodiments are not limited thereto or thereby.

The pixel PXij includes an organic light emitting diode ED and a circuit CP controlling the organic light emitting diode ED. In some exemplary embodiments, the circuit CP includes eight transistors T1 to T8 and one storage capacitor Cst. In addition, each of the eight transistors T1 to T8 is a p-type transistor, but the configuration of the pixel is not limited to that shown in FIG. 3. The circuit CP shown in FIG. 3 merely corresponds to one example, and the configuration of the circuit CP may be modified.

Referring to FIG. 3, the circuit CP includes first, second, third, fourth, fifth, sixth, seventh, and eighth transistors T1, T2, T3, T4, T5, T6, T7, and T8. The first transistor T1 includes an input electrode connected to a first node N1, a control electrode connected to a second node N2, and an output electrode connected to a third node N3. The second transistor T2 is connected between the j-th data line and the first transistor T1, and the third transistor T3 is connected between the second node N2 and the third node N3. The fourth transistor T4 is connected between the third node N3 and the anode electrode of the organic light emitting diode ED. The storage capacitor Cst includes a first electrode connected to the second node N2 and a second electrode connected to a first voltage node VN1 to which the first driving voltage ELVDD is applied.

The fifth transistor T5 is connected between the first node N1 and the first voltage node VN1, and the sixth transistor T6 is connected between the second node N2 and a first initialization node IN1 to which the first initialization voltage Vint1 is applied. The seventh transistor T7 is connected between the anode electrode of the organic light emitting diode ED and a second initialization node IN2 to which the second initialization voltage Vint2 is applied. The eighth transistor T8 is connected between the first voltage node VN1 and the first node N1.

In more detail, the first transistor T1 includes the input electrode connected to the first node N1 receiving the first driving voltage ELVDD through the fifth transistor T5, the control electrode connected to the second node N2, and the output electrode connected to the third node N3. The output electrode of the first transistor T1 applies the first driving voltage ELVDD to the anode electrode of the organic light emitting diode ED through the fourth transistor T4. The first transistor T1 controls a driving current supplied to the organic light emitting diode ED in response to an electric potential of the second node N2. The first transistor T1 may be referred to as a "driving transistor."

The second transistor T2 includes an input electrode connected to the j-th data line, a control electrode connected to the i-th scan line, and an output electrode connected to the first node N1, and, thereby, the input electrode of the first transistor T1. The second transistor T2 is turned on by a scan signal GSi applied to the i-th scan line and provides a data signal DSj applied to the j-th data line to the first node N1. The second transistor T2 may be referred to as a "switching transistor."

The third transistor T3 includes an input electrode connected to the third node N3, and, thereby, the output electrode of the first transistor T1, a control electrode connected to the i-th scan line, and an output electrode connected to the second node N2. The third transistor T3 is turned on in response to the scan signal GSi applied to the i-th scan line. The third transistor T3 may be referred to as a "first control transistor." When the third transistor T3 is turned on, the first transistor T1 is connected in a diode configuration by the turned-on third transistor T3.

The fourth transistor T4 includes an input electrode connected to the third node N3, a control electrode connected to the i-th light emitting line, and an output electrode connected to the anode electrode of the organic light emitting diode ED. The fifth transistor T5 includes an input electrode connected to the first voltage node VN1, a control electrode connected to the i-th light emitting line, and an output electrode connected to the first node N1.

The fourth and fifth transistors T4 and T5 are turned on or off in response to a light emitting control signal ESi provided through the i-th light emitting line. A current path is formed or cut off between the first voltage node VN1 and the organic light emitting diode ED according to an operation of the fourth and fifth transistors T4 and T5. The fourth and fifth transistors T4 and T5 may be respectively referred to as "second and third control transistors." According to some exemplary embodiments, the fifth transistor T5 may be omitted, and the input electrode of the first transistor T1 may be directly connected to the first voltage node VN1.

The sixth transistor T6 includes an input electrode receiving the first initialization voltage Vint1, a control electrode receiving an initialization control signal, and an output electrode connected to the second node N2, and, thereby, the control electrode of the first transistor T1. The sixth transistor T6 is turned on in response to the initialization control signal and provides the first initialization voltage Vint1 to the second node N2. In some exemplary embodiments, the initialization control signal may be an (i−1)-th scan signal GSi−1 applied to an (i−1)-th scan line. For descriptive convenience, the initialization control signal will, hereinafter, be referred to as initialization control signal GSi−1. The second node N2 is initialized by the first initialization voltage Vint1. In this case, the sixth transistor T6 may be referred to as a "first initialization transistor."

The seventh transistor T7 includes an input electrode receiving the second initialization voltage Vint2, a control electrode receiving the initialization control signal GSi−1, and an output electrode connected to the anode electrode of the organic light emitting diode ED. The seventh transistor T7 is turned on in response to the initialization control signal GSi−1 and provides the second initialization voltage Vint2 to the anode electrode of the organic light emitting diode ED. Accordingly, the anode electrode of the organic light emitting diode ED is initialized by the second initialization voltage Vint2. That is, the anode electrode of the organic light emitting diode ED is discharged to the second initialization voltage Vint2. The second initialization voltage Vint2 has the constant electric potential difference Vd with respect to the second driving voltage ELVSS. The second initialization voltage Vint2 is determined by the voltage level of the second driving voltage ELVSS. The seventh transistor T7 may be referred to as a "second initialization transistor."

Although a configuration in which the sixth and seventh transistors T6 and T7 are substantially simultaneously turned on by the initialization control signal GSi−1 has been described, exemplary embodiments are not limited thereto or thereby. For instance, the sixth and seventh transistors T6 and T7 may be turned on at different periods.

The eighth transistor T8 includes an input electrode connected to the first voltage node VN1 to receive the first driving voltage ELVDD, a control electrode receiving an on-bias control signal, and an output electrode connected to the first node N1. The eighth transistor T8 is turned on in response to the on-bias control signal to apply the first driving voltage ELVDD to the first node N1. The eighth transistor T8 may be referred to as an "on-bias transistor."

According to some exemplary embodiments, the on-bias control signal may be the scan signal GSi−1 applied to the (i−1)-th scan line. Therefore, the on-bias control signal GSi−1 may be substantially the same signal as the initialization control signal GSi−1. Accordingly, the eighth transistor T8 may be substantially simultaneously turned on with the sixth and seventh transistors T6 and T7. For example, the eighth transistor T8 is turned on in the initialization period in which the second node N2 is initialized to the first initialization voltage Vint1 by the sixth transistor T6, and thus, the first driving voltage ELVDD may be applied to the first node N1. As an example, in a case that the first initialization voltage Vint1 is about −4.5 volts and the first driving voltage ELVDD is about 4.6 volts (refer to FIG. 2), the electric potential of about 9.1 volts is formed between the input electrode and the control electrode of the first transistor T1 in the initialization period. That is, since the electric potential of the first node N1 is reset to the first driving voltage ELVDD by the eighth transistor T8 during the initialization period, a constant on-bias voltage may be applied between the input electrode and the control electrode of the first transistor T1. Accordingly, deterioration in the display quality, which is caused when the electric potential difference between the control electrode and the input electrode of the first transistor T1 increases above a certain level by a hysteresis phenomenon, may be prevented.

The storage capacitor Cst is connected between the second node N2 and the first voltage node VN1 and charged with a voltage corresponding to a voltage difference between the first driving voltage ELVDD and the voltage applied to the second node N2.

Referring to FIG. 4, the organic light emitting display device displays a unit image at each of frame periods Fk−1 and Fk. Each of the pixels PX shown in FIG. 1 receives a corresponding data signal at each of frame periods Fk−1 and Fk. FIG. 4 shows the frame periods Fk−1 and Fk of the pixel PXij shown in FIG. 3. Hereinafter, the driving signals used to drive the pixels PX will be described focusing on a k-th frame period Fk. The k-th frame period Fk includes a scan period Sk and a light emitting period Ek.

The initialization control signal GSi−1 is activated in the scan period Sk. In some exemplary embodiments, the signals shown in FIG. 4 are activated at a low level. The low level of the signals shown in FIG. 4 may be a turn-on voltage of transistors to which the signals are applied.

The second node N2 is initialized to the first initialization voltage Vint1 by the initialization control signal GSi−1. The initialization control signal GSi−1 may be a scan signal applied to a scan line disposed before the i-th scan line among the scan lines SL1 to SLn (refer to FIG. 1). For instance, the initialization control signal GSi−1 may be the (i−1)-th scan signal GSi−1 applied to the (i−1)-th scan line disposed right before the i-th scan line, such as right before the i-th scan line with reference to the first scan line SL1. In addition, the anode electrode of the organic light emitting diode ED is initialized to the second initialization voltage Vint2 by the initialization control signal GSi−1.

Characteristics of black grayscale of the pixels and a degree of color spreading defect in the pixel may vary depending on the second initialization voltage Vint2 applied to the anode electrode of the organic light emitting diode ED. That is, when the second initialization voltage Vint2 is set to exceed a range of the constant electric potential difference Vd (refer to FIG. 2), e.g., a range from about 0.5 volts to about 0.6 volts, with respect to the second driving voltage ELVSS, the characteristics of the black grayscale is deteriorated and the color spreading defect occurs. Accordingly, the second initialization voltage Vint2 should be appropriately controlled depending on the voltage level of the second driving voltage ELVSS.

The i-th scan signal GSi applied to the i-th scan line is activated in the scan period Sk. The second transistor T2 is turned on by the i-th scan signal GSi, and the data signal DSj applied to the j-th data line is applied to the first node N1. Then, a current path is formed between the first node N1 and the organic light emitting diode ED by the light emitting control signal ESi during the light emitting period Ek. The light emitting control signal ESi has a low state during the light emitting period Ek. Accordingly, the organic light emitting diode ED emits the light during the light emitting period Ek. The light emitting control signal ESi is inactivated during the scan period Sk. That is, the light emitting control signal ESi has a high level during the scan period Sk.

The operation of the pixel PXij will be described in more detail with reference to FIGS. 5 to 12.

Figure 5:
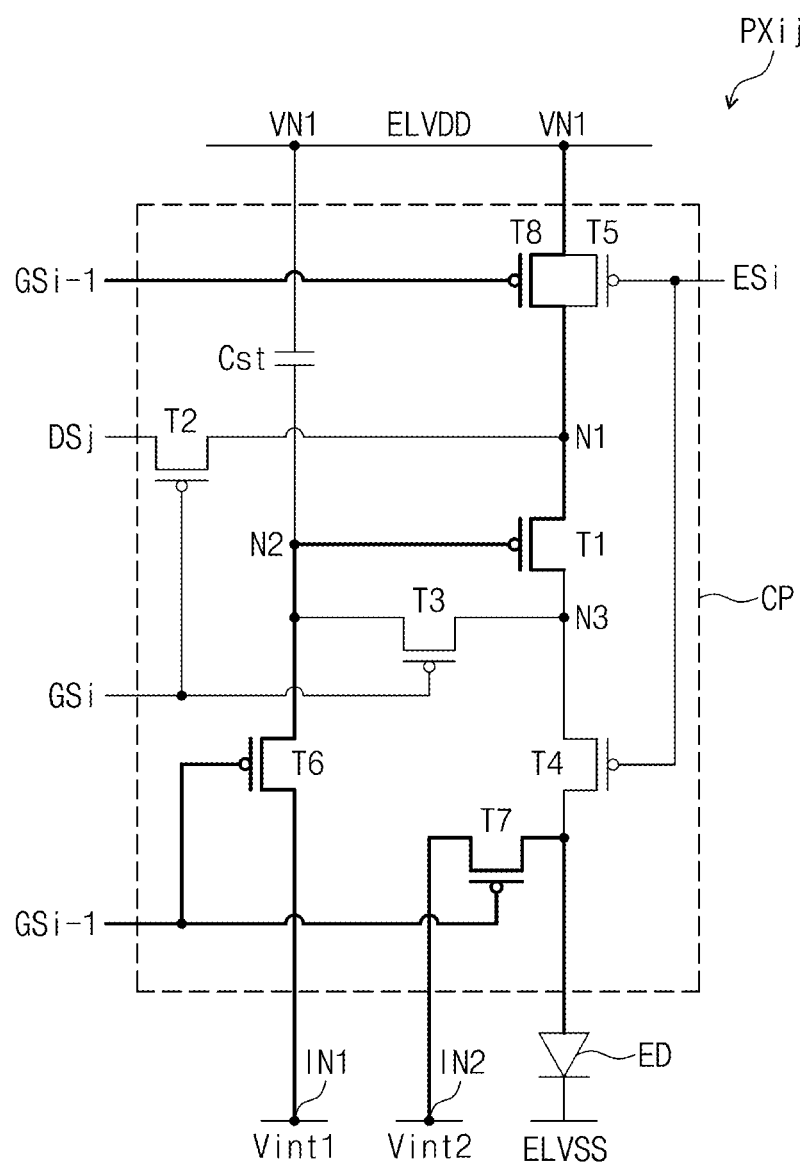
FIG. 5 is an equivalent circuit diagram showing an operation of the pixel of FIG. 3 during a first period according to some exemplary embodiments.
Figure 6:
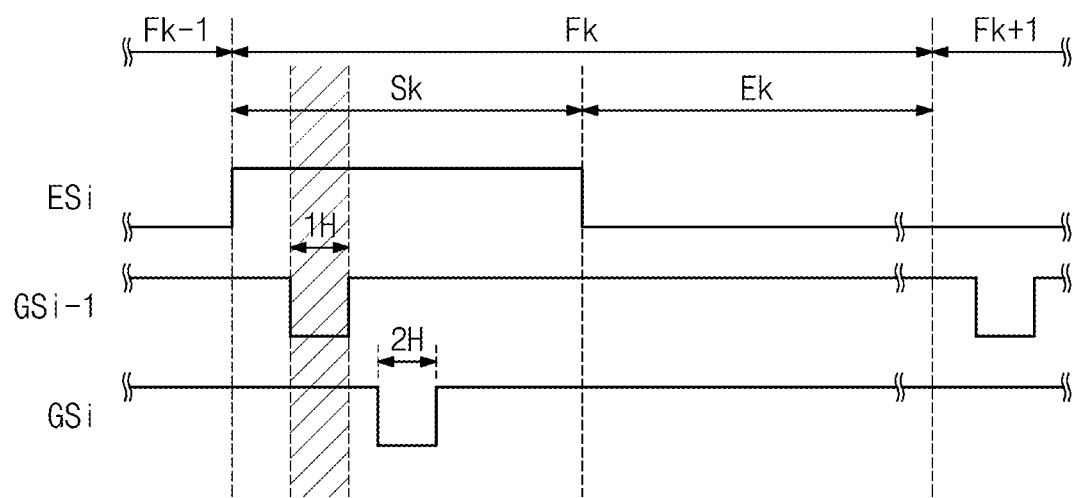
FIG. 6 is a waveform diagram showing waveforms of driving signals during the first period of FIG. 5 according to some exemplary embodiments.

FIG. 5 is an equivalent circuit diagram showing an operation of the pixel of FIG. 3 during a first period according to some exemplary embodiments. FIG. 6 is a waveform diagram showing waveforms of driving signals during the first period of FIG. 5 according to some exemplary embodiments.

Referring to FIGS. 5 and 6, the initialization control signal GSi-1 activated in the first period 1H of the scan period Sk is applied to the sixth transistor T6. Accordingly, the sixth transistor T6 is turned on, and the first initialization voltage Vint1 is applied to the second node N2 through the turned-on sixth transistor T6. The first initialization voltage Vint1 may be set to a voltage low enough to initialize the second node N2, for instance, a voltage lower than a data signal with highest grayscale by the threshold voltage of the first transistor T1.

The initialization control signal GSi-1 activated during the first period 1H is applied to the seventh transistor T7. Accordingly, the seventh transistor T7 is turned on, and the second initialization voltage Vint2 is applied to the anode electrode of the organic light emitting diode ED through the turned-on seventh transistor T7. The second initialization voltage Vint2 may be set to the voltage having the constant electric potential difference Vd with respect to the second driving voltage ELVSS. As an example, the electric potential difference Vd (refer to FIG. 2) between the second initialization voltage Vint2 and the second driving voltage ELVSS may be maintained in a range from about 0.5 volts to about 0.6 volts. In some exemplary embodiments, when the second driving voltage ELVSS has the voltage level of about −10 volts, the second initialization voltage Vint2 may have the voltage level of about −9.5 volts.

The anode electrode of the organic light emitting diode ED is initialized to the second initialization voltage Vint2 and the second node N2 is initialized to the first initialization voltage Vint1 during the first period 1H. Accordingly, the anode electrode of the organic light emitting diode ED and the second node N2 may have different electric potentials from each other during the first period 1H.

The activated on-bias control signal GSi-1 is applied to the eighth transistor T8 during the first period 1H. As such, the eighth transistor T8 is turned on, and the first driving voltage ELVDD is applied to the first node N1 through the turned-on eighth transistor T8.

In some exemplary embodiments, the initialization control signal GSi-1 and the on-bias control signal GSi-1 may be the scan signal GSi-1 applied to the (i-1)-th scan line. Therefore, the initialization control signal GSi-1 and the on-bias control signal GSi-1 is substantially simultaneously activated during the first period 1H. Accordingly, the eighth transistor T8 may be substantially simultaneously turned on with the sixth and seventh transistors T6 and T7. Due to the turned-on sixth and eighth transistors T6 and T8, the second node N2 is initialized to the first initialization voltage Vint1 during the first period 1H, and the first driving voltage ELVDD is applied to the first node N1 during the first period 1H. Accordingly, an electric potential difference corresponding to a difference between the first initialization voltage Vint1 and the first driving voltage ELVDD is formed between the input electrode and the control electrode of the first transistor T1. As an example, when the first initialization voltage Vint1 is about −4.5 volts and the first driving voltage ELVDD is about 4.6 volts (refer to FIG. 2), the electric potential difference of about 9.1 volts is formed between the input electrode and the control electrode of the first transistor T1.

As described above, the electric potential of the first node N1 is reset to the first driving voltage ELVDD by the eighth transistor T8 during the first period 1H. Accordingly, the constant on-bias voltage Vob (Vob=ELVDD−Vint1) may be applied between the input electrode and the control electrode of the first transistor T1 regardless of which data signal is applied to the first node N1 in the previous frame period Fk−1.

Figure 7:
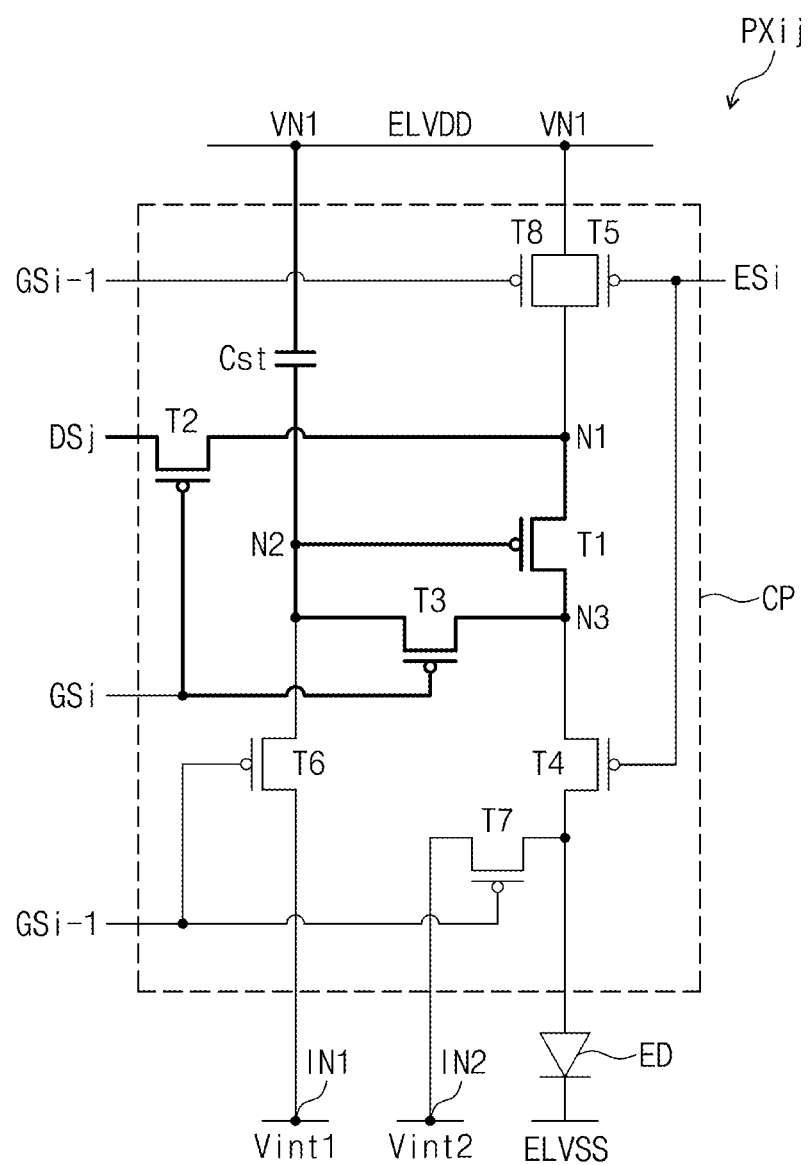
FIG. 7 is an equivalent circuit diagram showing an operation of the pixel of FIG. 3 during a second period according to some exemplary embodiments.
Figure 8:
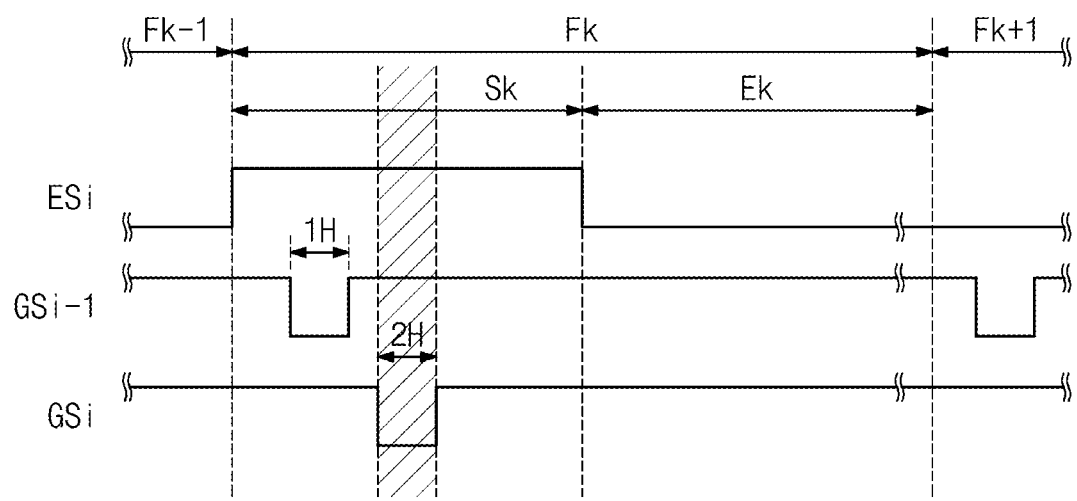
FIG. 8 is a waveform diagram showing waveforms of driving signals during the second period of FIG. 7 according to some exemplary embodiments.

FIG. 7 is an equivalent circuit diagram showing an operation of the pixel of FIG. 3 during a second period according to some exemplary embodiments. FIG. 8 is a waveform diagram showing waveforms of driving signals during the second period of FIG. 7 according to some exemplary embodiments.

Referring to FIGS. 7 and 8, the scan signal GSi activated during the second period 2H of the scan period Sk is applied to the i-th scan line. Accordingly, the second transistor T2 and the third transistor T3 are turned on, and the first transistor T1 is connected in a diode configuration by the third transistor T3.

The data signal DSj is applied to the j-th data line during the second period 2H. The data signal DSj is applied to the first node N1 through the second transistor T2. In this case, since the first transistor T1 is in the diode configuration, a voltage corresponding to a difference in voltage between the data signal DSj and the threshold voltage of the first transistor T1 is applied to the second node N2. The voltage applied to the second node N2 during the second period 2H is charged in the storage capacitor Cst. The voltage charged in the storage capacitor Cst is used as a driving voltage to drive the first transistor T1 in a period in which the second and third transistors T2 and T3 are turned off.

Figure 9:
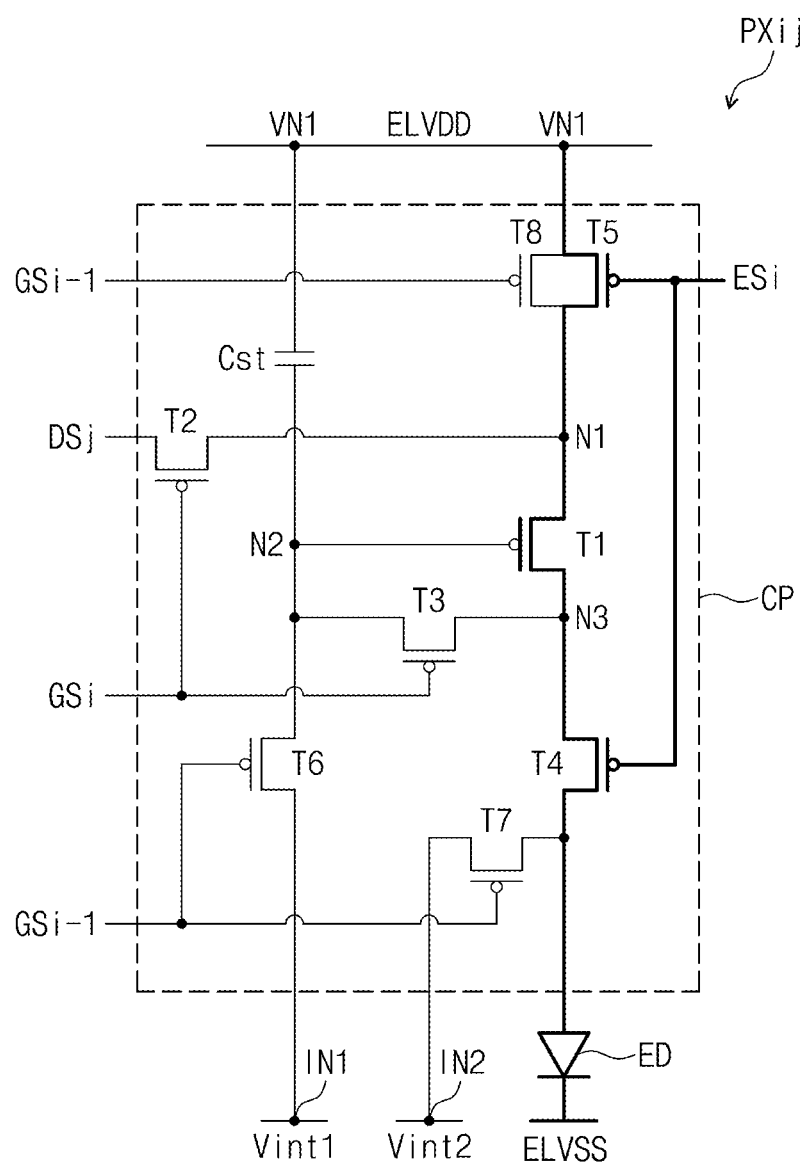
FIG. 9 is an equivalent circuit diagram showing an operation of the pixel of FIG. 3 during a third period according to some exemplary embodiments.
Figure 10:
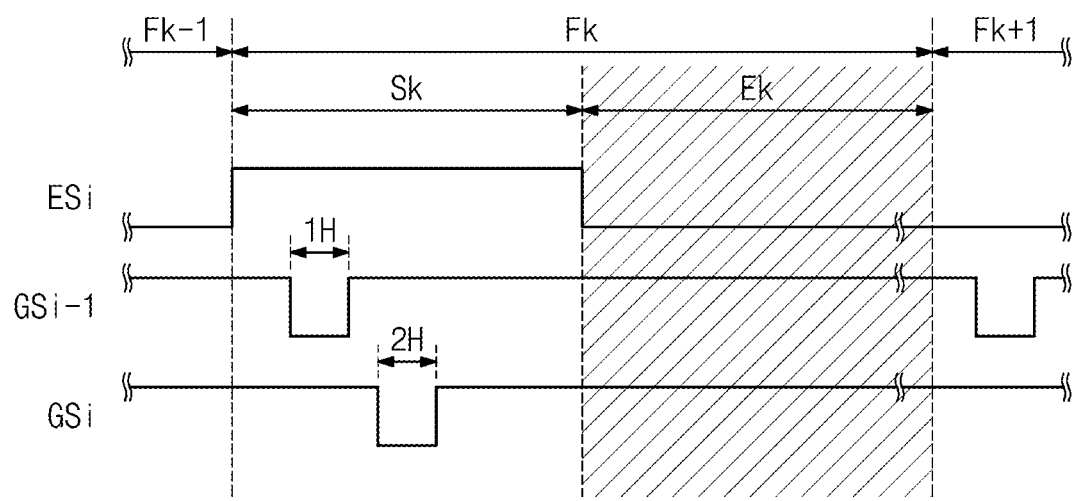
FIG. 10 is a waveform diagram showing waveforms of driving signals during the third period of FIG. 9 according to some exemplary embodiments.

FIG. 9 is an equivalent circuit diagram showing an operation of the pixel of FIG. 3 during a third period according to some exemplary embodiments. FIG. 10 is a waveform diagram showing waveforms of driving signals during the third period of FIG. 9 according to some exemplary embodiments.

Referring to FIGS. 9 and 10, the light emitting control signal ESi activated during the light emitting period Ek is applied to the i-th light emitting line. Accordingly, the fifth transistor T5 and the fourth transistor T4 are turned on. A current path is formed between the first driving voltage ELVDD and the second driving voltage ELVSS via the fifth transistor T5, the first transistor T1, the fourth transistor T4, and the organic light emitting diode ED.

The driving current flowing through the organic light emitting diode ED is controlled by the electric potential of the second node N2. The operation of the first transistor T1 is controlled depending on the data signal DSj applied to the second node N2 during the second period 2H.

The organic light emitting diode ED emits light with brightness corresponding to the data signal DSj during the light emitting period Ek.

Figure 11:
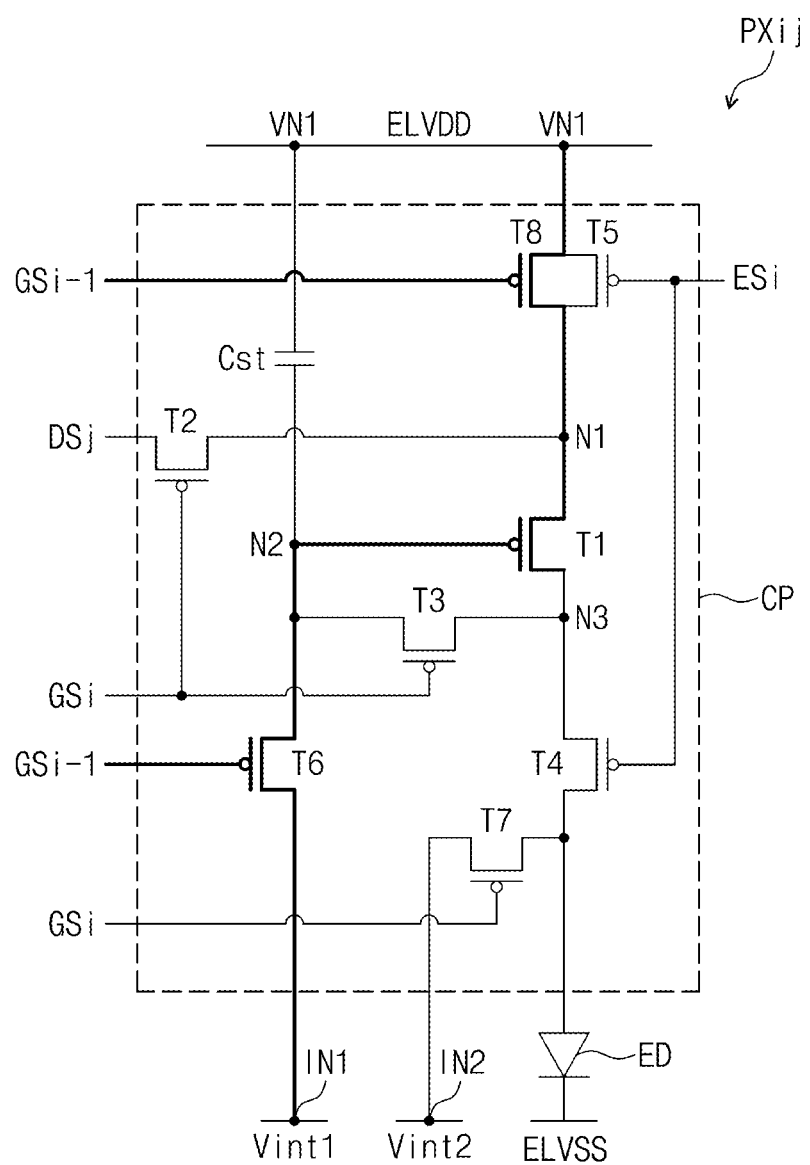
FIG. 11 is an equivalent circuit diagram showing an operation of the pixel of FIG. 3 during a first period according to some exemplary embodiments.
Figure 12:
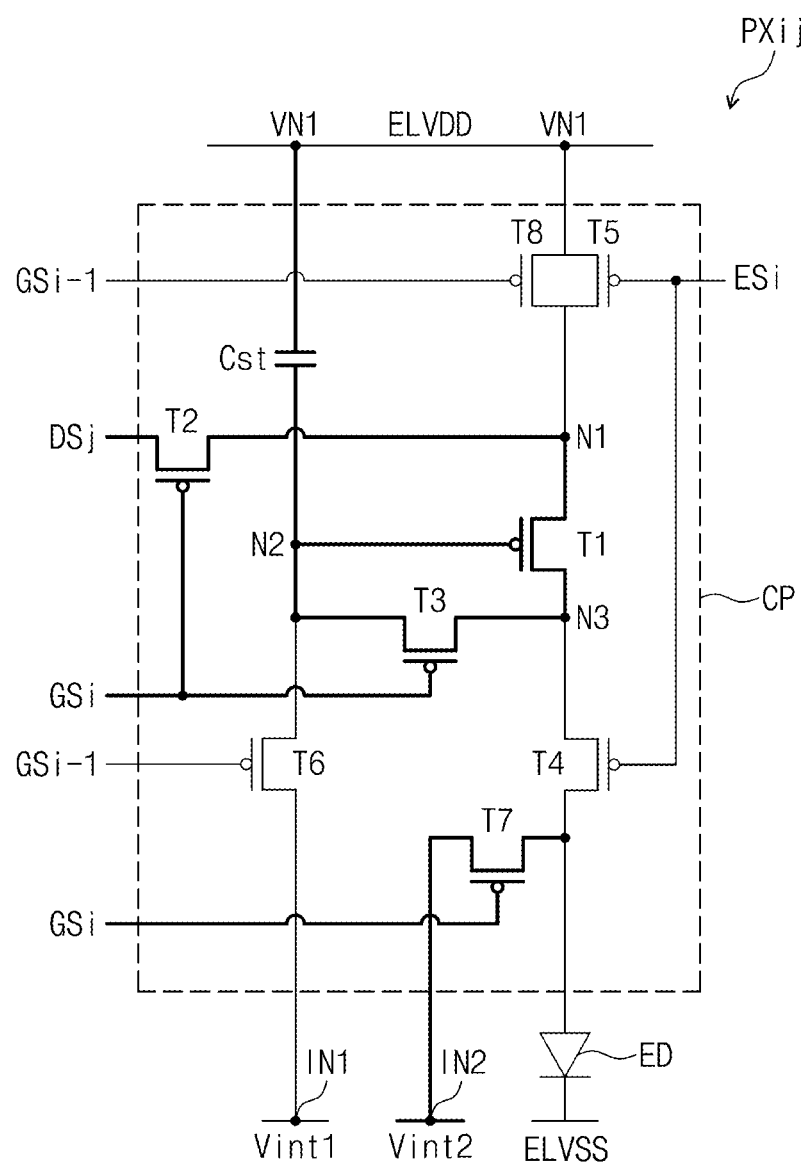
FIG. 12 is an equivalent circuit diagram showing an operation of the pixel of FIG. 3 during a second period according to some exemplary embodiments.

FIG. 11 is an equivalent circuit diagram showing an operation of the pixel of FIG. 3 during a first period according to some exemplary embodiments. FIG. 12 is an equivalent circuit diagram showing an operation of the pixel of FIG. 3 during a second period according to some exemplary embodiments.

Referring to FIGS. 6 and 11, the first initialization control signal GSi−1 is applied to the control electrode of the sixth transistor T6. The first initialization control signal GSi−1 is activated during the first period 1H of the scan period Sk. The sixth transistor T6 is turned on in response to the activated first initialization control signal GSi−1, and the first initialization voltage Vint1 is applied to the second node N2 through the turned-on sixth transistor T6.

The activated on-bias signal GSi−1 is applied to the eighth transistor T8 during the first period 1H. Accordingly, the eighth transistor T8 is turned on, and the first driving voltage ELVDD is applied to the first node N1 through the turned-on eighth transistor T8.

The on-bias control signal GSi−1 is substantially simultaneously activated with the first initialization control signal GSi−1 during the first period 1H. Accordingly, the eighth transistor T8 may be substantially simultaneously turned on with the sixth transistor T6. During the first period 1H, the second node N2 is initialized to the first initialization voltage Vint1, and the first driving voltage ELVDD is applied to the first node N1 due to the turned-on eighth transistor T8. Accordingly, an electric potential difference corresponding to a difference in voltage between the first initialization voltage Vint1 and the first driving voltage ELVDD is formed between the input electrode and the control electrode of the first transistor T1 during the first period 1H.

Accordingly, the constant on-bias voltage Vob (Vob=ELVDD−Vint1) may be applied between the input electrode and the control electrode of the first transistor T1 during the first period 1H regardless of which data signal is applied to the first node N1 in the previous frame period Fk−1.

The first initialization control signal GSi−1 and the on-bias control signal GSi−1 may be the scan signal applied to the scan line disposed before the i-th scan line among the scan lines SL1 to SLn (refer to FIG. 1), e.g., the (i−1)-th scan signal GSi−1 applied to the (i−1)-th scan line disposed right before the i-th scan line.

Referring to FIGS. 8 and 12, a second initialization control signal GSi activated during a period different from that of the first initialization control signal GSi−1 is applied to the control electrode of the seventh transistor T7.

When the second initialization control signal GSi activated during the second period 2H is applied to the seventh transistor T7, the seventh transistor T7 is turned on. The second initialization voltage Vint2 is applied to the anode electrode of the organic light emitting diode ED through the turned-on seventh transistor T7. The second initialization voltage Vint2 may be set to the voltage having the constant electric potential difference Vd with respect to the second driving voltage ELVSS. The anode electrode of the organic light emitting diode ED is initialized to the second initialization voltage Vint2 during the second period 2H.

In some exemplary embodiments, the second initialization control signal GSi may be the scan signal applied to the i-th scan line among the scan lines SL1 to SLn (refer to FIG. 1). However, the second initialization control signal GSi is not limited to the scan signal applied to the i-th scan line. for instance, the activation period of the second initialization control signal GSi should not be particularly limited as long as the electric potential of the anode electrode of the organic light emitting diode ED is discharged to the second initialization voltage Vint2 before the light emitting period Ek begins.

The scan signal GSi activated during the second period 2H is applied to the i-th scan line. Accordingly, the second transistor T2 and the third transistor T3 are turned on, and the first transistor T1 is connected in a diode configuration by the third transistor T3.

The data signal DSj is applied to the j-th data line during the second period 2H. The data signal DSj is applied to the first node N1 through the second transistor T2. In this case, since the first transistor T1 is in the diode configuration, the voltage corresponding to the difference in voltage between the data signal DSj and the threshold voltage of the first transistor T1 is applied to the second node N2. The voltage applied to the second node N2 during the second period 2H is charged in the storage capacitor Cst. The voltage charged in the storage capacitor Cst is used as the driving voltage to drive the first transistor T1 in the period in which the second and third transistors T2 and T3 are turned off.

Figure 13:
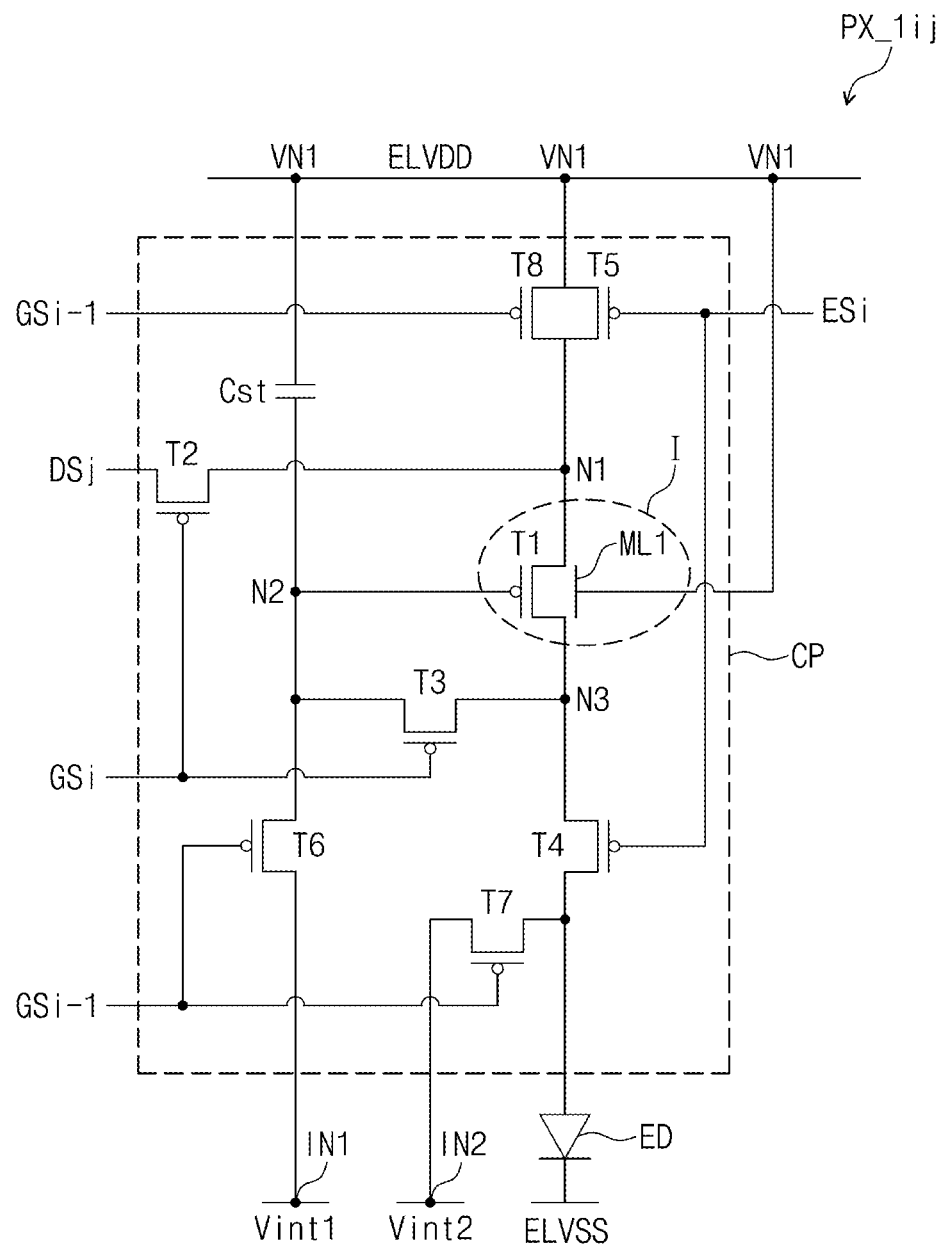
FIG. 13 is an equivalent circuit diagram of a pixel according to some exemplary embodiments.
Figure 14:
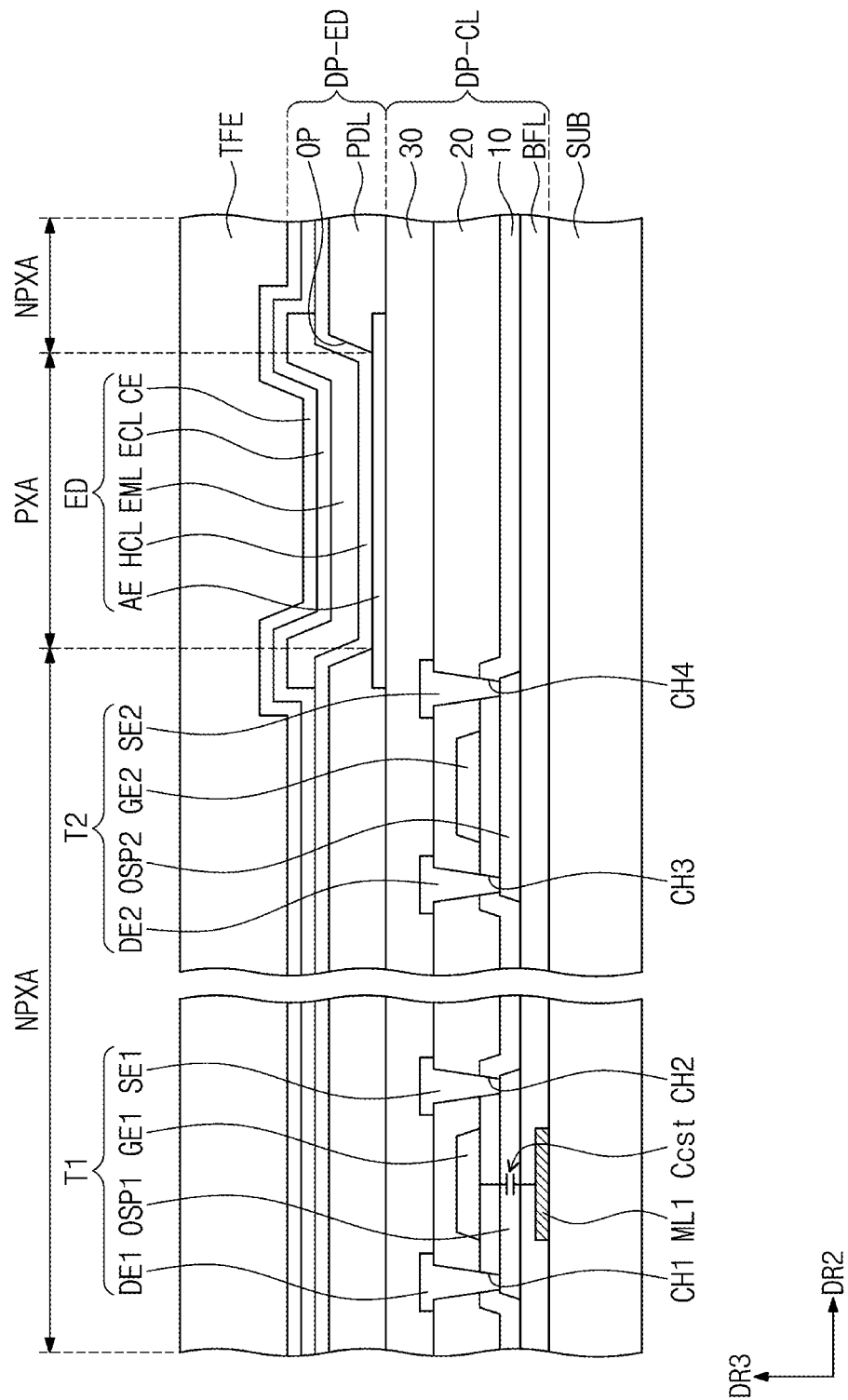
FIG. 14 is a cross-sectional view of the pixel of FIG. 13 at least including the portion "I" in FIG. 13 according to some exemplary embodiments.

FIG. 13 is an equivalent circuit diagram of a pixel according to some exemplary embodiments. FIG. 14 is a cross-sectional view of the pixel of FIG. 13 at least including the portion "I" in FIG. 13 according to some exemplary embodiments. In FIG. 13, the same reference numerals denote the same elements as in FIG. 3, and thus, detailed descriptions of the same elements will be omitted.

Referring to FIG. 13, the pixel PX_1ij further includes a first auxiliary electrode ML1 facing the control electrode of the first transistor T1. The first auxiliary electrode ML1 is connected to the first voltage node VN1 to receive the first driving voltage ELVDD. The first auxiliary electrode ML1 faces the control electrode of the first transistor T1 to form a sub-storage capacitor Ccst that increases a capacitance of the storage capacitor Cst.

When the capacitance of the storage capacitor Cst is not sufficiently secured, a Mura phenomenon, in which a brightness and a color of the image are uneven, may occur. As described above, when the sub-storage capacitor Ccst is formed using the first auxiliary electrode ML1, the display quality may be prevented from deteriorating due to the Mura phenomenon even though it is difficult to sufficiently secure the capacitance by using only the storage capacitor Cst due to a lack of space.

Referring to FIG. 14, a circuit device layer DP-CL, a display device layer DP-ED, and a thin film encapsulation layer TFE are sequentially disposed on a base layer SUB.

The circuit device layer DP-CL includes at least one inorganic layer, at least one organic layer, and a circuit device. The circuit device layer DP-CL includes a buffer layer BFL that is an inorganic layer, a first intermediate inorganic layer 10, a second intermediate inorganic layer 20, and an intermediate organic layer 30 that is an organic layer.

The inorganic layers may include at least one of silicon nitride, silicon oxy-nitride, and silicon oxide. The organic layer may include at least one of an acryl-based resin, a methacryl-based resin, a polyisoprene-based resin, a vinyl-based resin, an epoxy-based resin, an urethane-based resin, a cellulose-based resin, a siloxane-based resin, a polyimide-based resin, a polyamide-based resin, and a parylene-based resin. The circuit device includes conductive patterns and/or semiconductor patterns.

The buffer layer BFL improves an adhesive strength between the base layer SUB and the conductive patterns or the semiconductor patterns. Although not shown separately, a barrier layer may be further disposed above the base layer SUB to prevent a foreign substance from entering. The buffer layer BFL and the barrier layer may be selectively disposed or omitted.

In some exemplary embodiments, the first auxiliary electrode ML1 is disposed above the base layer SUB and covered by the buffer layer BFL.

A semiconductor pattern OSP1 (hereinafter, referred to as a "first semiconductor pattern") of the first transistor T1 and a semiconductor pattern OSP2 (hereinafter, referred to as a "second semiconductor pattern") of the second transistor T2 are disposed on the buffer layer BFL. The first semiconductor pattern OSP1 and the second semiconductor pattern OSP2 may include amorphous silicon, poly silicon, or metal oxide semiconductor.

The first intermediate inorganic layer 10 is disposed on the first semiconductor pattern OSP1 and the second semiconductor pattern OSP2. A control electrode GE1 (hereinafter, referred to as a "first control electrode") of the first transistor T1 and a control electrode GE2 (hereinafter, referred to as a "second control electrode") of the second transistor T2 are disposed on the first intermediate inorganic layer 10. The first control electrode GE1 and the second control electrode GE2 may be formed through the same photolithography process as the scan lines SL1 to SLn (refer to FIG. 1).

The first control electrode GE1 is disposed to face the first auxiliary electrode ML1 to form the sub-storage capacitor Ccst connected to the storage capacitor Cst (refer to FIG. 13). In addition, the first auxiliary electrode ML1 is disposed under the first semiconductor pattern OSP1. In some exemplary embodiments, the first auxiliary electrode ML1 may be formed of a metal material, e.g., molybdenum, aluminum, chromium, etc.

The second intermediate inorganic layer 20 is disposed above the first intermediate inorganic layer 10 to cover the first control electrode GE1 and the second control electrode GE2. An output electrode DE1 (hereinafter, referred to as a "first output electrode DE1") and an input electrode SE1 (hereinafter, referred to as a "first input electrode SE1") of the first transistor T1 and an output electrode DE2 (hereinafter, referred to as a "second output electrode DE2") and an input electrode SE2 (hereinafter, referred to as a "second input electrode SE2") of the second transistor T2 are disposed on the second intermediate inorganic layer 20.

The first output electrode DE1 and the first input electrode SE1 are connected to the first semiconductor pattern OSP1 respectively through a second contact hole CH2 and a first contact hole CH1, which are defined through the first intermediate inorganic layer 10 and the second intermediate inorganic layer 20. The second output electrode DE2 and the second input electrode SE2 are connected to the second semiconductor pattern OSP2 respectively through a fourth contact hole CH4 and a third contact hole CH3, which are defined through the first intermediate inorganic layer 10 and the second intermediate inorganic layer 20. In some exemplary embodiments, portions of the first transistor T1 and the second transistor T2 may be implemented in a bottom-gate structure.

The intermediate organic layer 30 is disposed above the second intermediate inorganic layer 20 to cover the first output electrode DE1, the second output electrode DE2, the first input electrode SE1, and the second input electrode SE2. The intermediate organic layer 30 may provide a flat surface.

The display device layer DP-ED is disposed on the intermediate organic layer 30. The display device layer DP-ED includes a pixel definition layer PDL and the organic light emitting diode ED. The pixel definition layer PDL includes an organic material, which may be the same as the intermediate organic layer 30. The anode electrode AE of the organic light emitting diode ED is disposed on the intermediate organic layer 30. The pixel definition layer PDL includes an opening OP formed therethrough. The opening OP of the pixel definition layer PDL exposes at least a portion of the anode electrode AE.

The pixel PX_1$ij$ may be disposed in a pixel area when viewed in a plan view. The pixel area includes a light emitting area PXA and a non-light emitting area NPXA adjacent to the light emitting area PXA. The non-light emitting area NPXA may surround the light emitting area PXA. In some exemplary embodiments, the light emitting area PXA is defined to correspond to a portion of the anode electrode AE exposed through the opening OP.

A hole control layer HCL may be commonly disposed in the light emitting area PXA and the non-light emitting area NPXA. Although not shown separately, a common layer, such as the hole control layer HCL, may be commonly formed over the pixels PX (refer to FIG. 1).

A light emitting layer EML is disposed on the hole control layer HCL. The light emitting layer EML is disposed in an area corresponding to the opening OP. For instance, the light emitting layer EML may be formed in each of the pixels PX after being divided. The light emitting layer EML may include an organic material and/or an inorganic material. As seen in FIG. 14, the light emitting layer EML is patterned as a representative example; however, the light emitting layer EML may be commonly disposed over the pixels PX. In this case, the light emitting layer EML may generate white light. In addition, the light emitting layer EML may have a multi-layer structure.

An electron control layer ECL is disposed on the light emitting layer EML. Although not shown separately, the electron control layer ECL may be commonly formed over the pixels PX (refer to FIG. 1). A cathode electrode CE of the organic light emitting diode ED is disposed on the electron control layer ECL. The cathode electrode CE is commonly disposed over the pixels PX.

The thin film encapsulation layer TFE is disposed on the cathode electrode CE of the organic light emitting diode ED. The thin film encapsulation layer TFE is commonly disposed over the pixels PX. In some exemplary embodiments, the thin film encapsulation layer TFE directly covers the cathode electrode CE. Although not shown, a capping layer may be further disposed between the thin film encapsulation layer TFE and the cathode electrode CE to cover the cathode electrode CE. In this case, the thin film encapsulation layer TFE may directly cover the capping layer.

Figure 15:
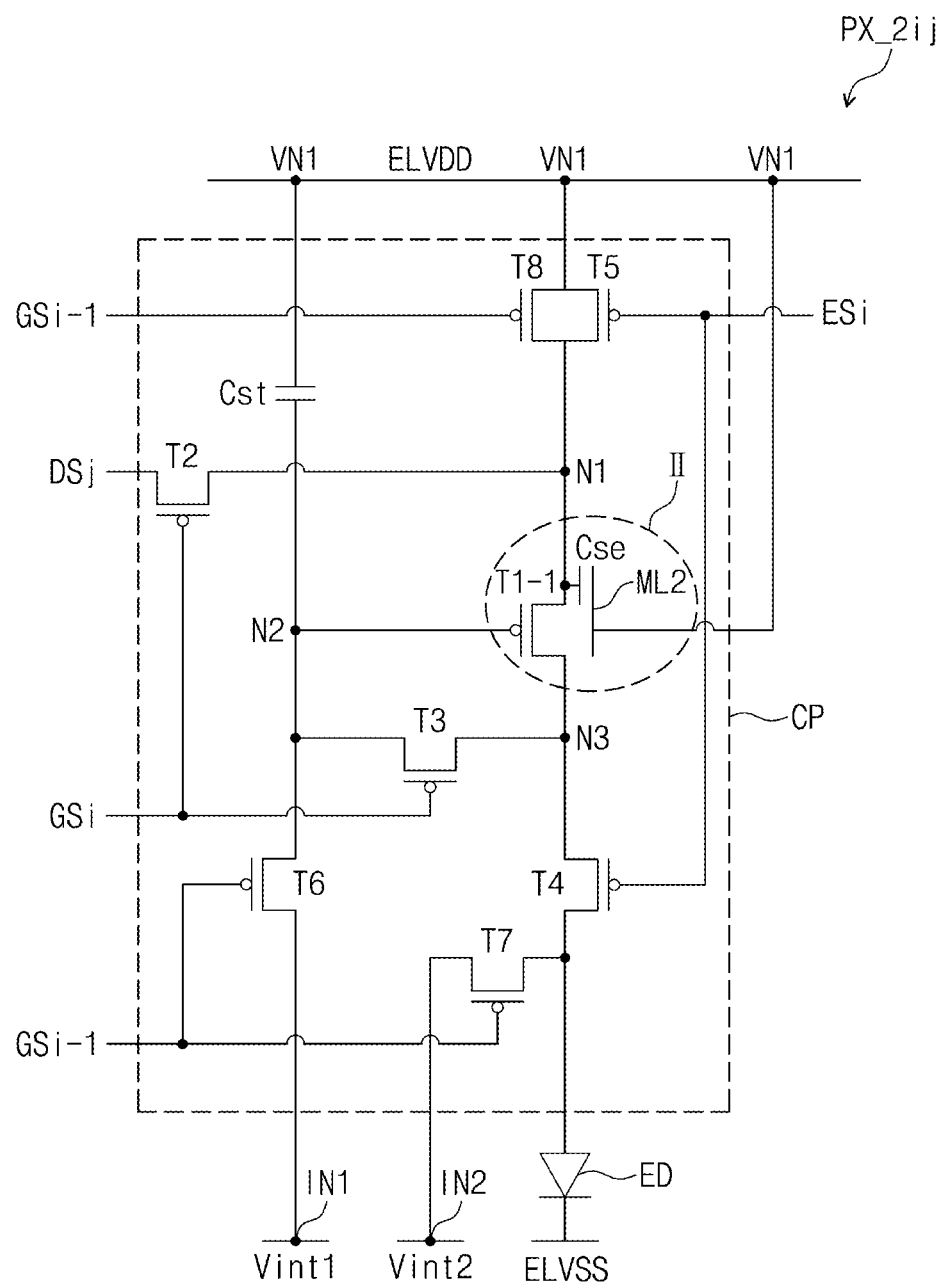
FIG. 15 is an equivalent circuit diagram showing a pixel according to some exemplary embodiments.
Figure 16:
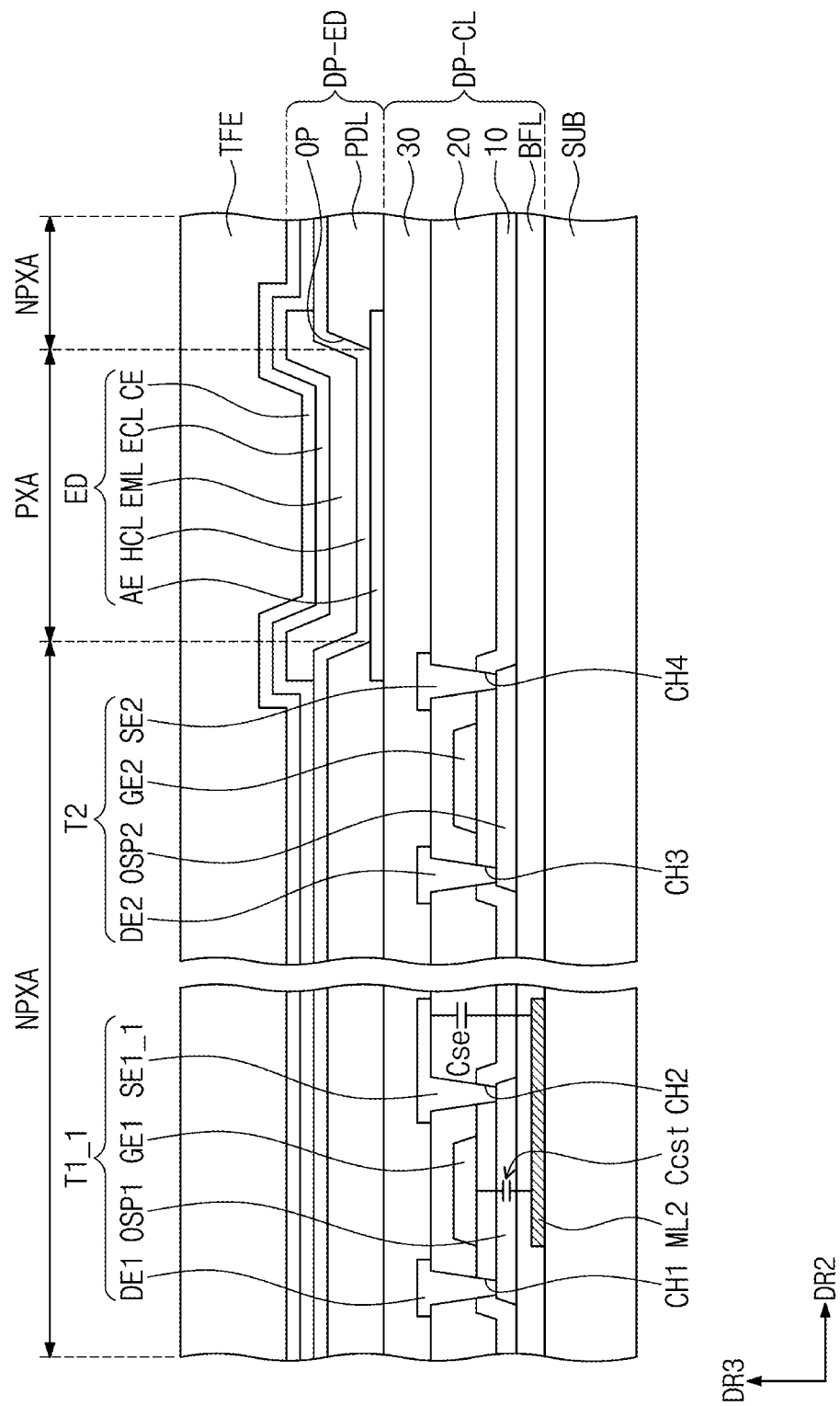
FIG. 16 is a cross-sectional view of the pixel of FIG. 15 at least including the portion "II" in FIG. 15 according to some exemplary embodiments.

FIG. 15 is an equivalent circuit diagram showing a pixel according to some exemplary embodiments. FIG. 16 is a cross-sectional view of the pixel of FIG. 15 at least including the portion "II" in FIG. 15 according to some exemplary embodiments. In FIGS. 15 and 16, the same reference numerals denote the same elements as in FIGS. 13 and 14, and thus, detailed descriptions of the same elements will be omitted.

Referring to FIGS. 15 and 16, the pixel PX_2$ij$ further includes a second auxiliary electrode ML2 facing the control electrode of the first transistor T1_1. The second auxiliary electrode ML2 is connected to the first voltage node VN1 to receive the first driving voltage ELVDD. The second auxiliary electrode ML2 may face not only the first control electrode GE1 of the first transistor T1_1, but also the first input electrode SE1_1 of the first transistor T1_1.

Accordingly, the second auxiliary electrode ML2 may further form a sub-storage capacitor Ccst that increases the capacitance of the storage capacitor Cst and an auxiliary capacitor Cse between the first input electrode SE1_1 and the first voltage node VN1.

The auxiliary capacitor Cse may improve a horizontal line defect occurring in the structure in which the light emitting control signal ESi is activated several times in the light emitting period Ek (refer to FIG. 4).

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A pixel comprising:
   a light emitting diode comprising an anode electrode and a cathode electrode, the cathode electrode being configured to receive a second driving voltage;
   a driving transistor comprising an input electrode connected to a first node, a control electrode connected to a second node, and an output electrode connected to a third node;
   a switching transistor configured to apply a data signal to the first node in response to reception of a scan signal in a second period;
   a first initialization transistor configured to apply a first initialization voltage to the second node in response to reception of an initialization control signal in a first period; and
   a second initialization transistor configured to apply a second initialization voltage having a voltage level different from the first initialization voltage to the anode electrode in response to reception of the initialization control signal in the first period,
   wherein:
   the first initialization transistor and the second initialization transistor are configured to be substantially simultaneously turned on in the first period;
   the second driving voltage has a voltage level lower than the second initialization voltage; and
   a difference in electric potential between the second driving voltage and the second initialization voltage is less than a threshold of the light emitting diode.

2. The pixel of claim 1, wherein:
   the first initialization transistor comprises a control electrode configured to receive the initialization control signal in the first period, an input electrode configured to receive the first initialization voltage, and an output electrode connected to the second node; and
   the second initialization transistor comprises a control electrode configured to receive the initialization control signal, an input electrode configured to receive the second initialization voltage, and an output electrode connected to the anode electrode.

3. The pixel of claim 2, wherein the second initialization voltage has a voltage level lower than the first initialization voltage.

4. The pixel of claim 3, wherein the second driving voltage is in a range from about −9 volts to about −11 volts.

5. The pixel of claim 2, wherein the switching transistor comprises a control electrode configured to receive the scan signal in the second period, an input electrode configured to receive the data signal, and an output electrode connected to the first node.

6. The pixel of claim 1, wherein the difference in electric potential is in a range from about 0.5 volts to about 0.6 volts.

7. The pixel of claim 1, further comprising:
   a first control transistor comprising a control electrode configured to receive the scan signal in the second period, an input electrode connected to the second node, and an output electrode connected to an output electrode of the driving transistor.

8. The pixel of claim 1, further comprising:
   a second control transistor comprising a control electrode configured to receive a light emitting control signal in a light emitting period, an input electrode connected to the third node, and an output electrode connected to the anode electrode of the light emitting diode; and
   a third control transistor comprising a control electrode configured to receive the light emitting control signal, an input electrode configured to receive a first driving voltage different from the second driving voltage, and an output electrode connected to the first node.

9. The pixel of claim 1, further comprising:
   a storage capacitor connected between the second node and a node configured to receive a first driving voltage different from the second driving voltage.

10. The pixel of claim 9, further comprising:
    a first auxiliary electrode facing the control electrode of the driving transistor,
    wherein the first auxiliary electrode is configured to receive the first driving voltage.

11. The pixel of claim 10, wherein the first auxiliary electrode also faces the input electrode of the driving transistor.

12. A pixel comprising:
    a light emitting diode comprising an anode electrode and a cathode electrode;
    a driving transistor comprising an input electrode connected to a first node, a control electrode connected to a second node, and an output electrode connected to a third node;
    a switching transistor configured to apply a data signal to the first node in response to reception of a scan signal in a second period;
    a first initialization transistor configured to apply a first initialization voltage to the second node in response to reception of a first initialization control signal in a first period; and
    a second initialization transistor configured to apply a second initialization voltage having a voltage level different from the first initialization voltage to the anode electrode in response to reception of a second initialization control signal,
    wherein the switching transistor and the second initialization transistor are configured to be substantially simultaneously turned on in the second period.

13. The pixel of claim 12, wherein:
    the first initialization control signal is configured to turn on the first initialization transistor in the first period; and
    the second initialization control signal is configured to turn on the second initialization transistor in the second period.

14. The pixel of claim 13, wherein:
    the first initialization transistor comprises a control electrode configured to receive the first initialization control signal in the first period, an input electrode configured to receive the first initialization voltage, and an output electrode connected to the second node; and the second initialization transistor comprises a control electrode configured to receive the second initialization control signal, an input electrode configured to receive the second initialization voltage, and an output electrode connected to the anode node.

15. The pixel of claim 14, wherein the second initialization voltage has a voltage level lower than the first initialization voltage.

16. The pixel of claim 15, wherein:
the cathode electrode of the light emitting diode is configured receive a second driving voltage; and
the second driving voltage has a voltage level lower than the second initialization voltage.

17. The pixel of claim 14, further comprising:
a first control transistor comprising a control electrode configured to receive the scan signal in the second period, an input electrode connected to the second node, and an output electrode connected to an output electrode of the driving transistor.

18. A light emitting display device comprising:
a scan driver configured to apply scan signals to scan lines extending in a first direction and arranged in a second direction crossing the first direction;
a data driver configured to apply data signals to data lines insulated from the scan lines;
pixels, at least one pixel among the pixels comprising:
a light emitting diode comprising an anode electrode and a cathode electrode, the cathode electrode being configured to receive a second driving voltage; and
a circuit configured to control a light emitting operation of the light emitting diode; and an initialization voltage generator configured to generate the first and second initialization voltages and to apply the first and second initialization voltages to the at least one pixel, wherein:

the circuit comprises:
a driving transistor comprising an input electrode connected to a first node, a control electrode connected to a second node, and an output electrode connected to a third node;
a switching transistor configured to apply a data signal among the data signals to the first node in response to reception of a scan signal among the scan signals in a second period;
a first initialization transistor configured to apply a first initialization voltage to the second node in response to reception of an initialization control signal in a first period; and
a second initialization transistor configured to apply a second initialization voltage having a voltage level different from the first initialization voltage to the anode electrode in response to reception of the initialization control signal in the first period;

the first initialization transistor and the second initialization transistor are connected to a same scan line among the scan lines to receive the initialization control signal;

the second driving voltage has a voltage level lower than the second initialization voltage; and a difference in electric potential between the second driving voltage and the second initialization voltage is less than a threshold voltage of the light emitting diode.

* * * * *